US006905922B2

(12) United States Patent
Lin et al.

(10) Patent No.: US 6,905,922 B2
(45) Date of Patent: Jun. 14, 2005

(54) DUAL FULLY-SILICIDED GATE MOSFETS

(75) Inventors: Chuan-Yi Lin, Hsin-Chu (TW); Yee-Chia Yeo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/678,710

(22) Filed: Oct. 3, 2003

(65) Prior Publication Data
US 2005/0074932 A1 Apr. 7, 2005

(51) Int. Cl.[7] .......................................... H01L 21/8238
(52) U.S. Cl. ...................... 438/199; 438/197; 438/682; 438/630; 438/592; 438/664; 438/305; 438/303; 438/286; 438/301; 438/224; 438/229; 438/230; 438/231; 257/757; 257/250; 257/407; 257/408
(58) Field of Search .................... 438/224, 229–231, 438/286, 301, 303, 305, 153, 154, 592, 664, 682, 630, 199, 197; 257/757, 250, 407–408

(56) References Cited

U.S. PATENT DOCUMENTS

| | | | | |
|---|---|---|---|---|
| 6,008,141 A | * | 12/1999 | Ibara et al. | 438/754 |
| 6,037,233 A | * | 3/2000 | Liu et al. | 438/304 |
| 6,074,915 A | * | 6/2000 | Chen et al. | 438/258 |
| 6,103,610 A | * | 8/2000 | Blair | 438/592 |
| 6,136,705 A | * | 10/2000 | Blair | 438/682 |
| 6,150,243 A | * | 11/2000 | Wieczorek et al. | 438/558 |
| 6,204,103 B1 | * | 3/2001 | Bai et al. | 438/224 |
| 6,232,227 B1 | * | 5/2001 | Mikagi | 438/655 |
| 6,465,309 B1 | | 10/2002 | Xiang et al. | |
| 6,475,874 B2 | | 11/2002 | Xiang et al. | |
| 6,518,154 B1 | | 2/2003 | Buynoski et al. | |
| 6,610,564 B2 | * | 8/2003 | Fukada et al. | 438/231 |
| 6,620,718 B1 | * | 9/2003 | Wieczorek et al. | 438/592 |
| 6,642,119 B1 | * | 11/2003 | Pelella et al. | 438/303 |
| 2001/0009791 A1 | * | 7/2001 | Ahmad et al. | 438/300 |
| 2002/0197804 A1 | * | 12/2002 | Ahmad et al. | 438/300 |
| 2004/0065930 A1 | * | 4/2004 | Lin et al. | 257/412 |

OTHER PUBLICATIONS

Tavel, B., et al., "Totally Silicided ($CoSi_2$) Polysilicon: A Novel Approach To Very Low–Resistive Gate (~2Ω/□) Without Metal CMP Nor Etching)" IEDM (Mar. 2001) pp. 825–828.

Maszara, W.P., et al., "Transistors With Dual Work Function Metal Gates By Single Full Silicidation (FUSI) Of Polysilicon," IEDM (Feb. 2002) pp. 367–370.

* cited by examiner

Primary Examiner—Matthew Smith
Assistant Examiner—B. V. Keshavan
(74) Attorney, Agent, or Firm—Slater & Matsil, L.L.P.

(57) ABSTRACT

A semiconductor device having a plurality of silicidation steps is provided. In the preferred embodiment in which the semiconductor device is a MOSFET, the source/drain regions are silicided. A dielectric layer is formed and the etch stop layer is removed from the gate electrode of the MOSFET. A second silicidation process is performed to silicide the gate electrode. The process may be performed individually for each transistor, allowing the electrical characteristics of each transistor to be determined individually.

41 Claims, 7 Drawing Sheets

DUAL FULLY-SILICIDED GATE MOSFETS

TECHNICAL FIELD

The present invention relates generally to semiconductor devices, and more particularly to semiconductor devices with gate electrodes formed by silicidation.

BACKGROUND

Complementary metal oxide semiconductor (CMOS) devices, such as metal oxide semiconductor field-effect transistors (MOSFETs), are commonly used in the fabrication of ultra-large scale integrated (ULSI) devices. The continuing trend is to reduce the size of the devices and to lower the power consumption requirements. Size reduction of the MOSFETs has enabled the continued improvement in speed performance, density, and cost per unit function of integrated circuits.

FIG. 1 illustrates one type of a MOSFET formed on a substrate 110. The MOSFET generally has source/drain regions 112 and gate electrodes 116. A channel 118 is formed between the source/drain regions 112. The gate electrode 116 is formed on a dielectric layer 120. Spacers 122 are formed on each side of the gate electrode 116, and contact pads or silicide pads 124 are formed on the source/drain regions 112 and the gate electrodes 116. The source/drain regions 112 and/or the contact pads 124 may be raised. Isolation trenches 126 may be used to isolate the MOSFETs from each other and other devices (not shown).

The contact pads 124 provide reduced contact resistance and are frequently formed of a metal silicide. Furthermore, the contact pad 124 on the gate electrode 116 is generally formed in the same process steps as the contact pad 124 on the source/drain regions 112, and thus, has the same characteristics. Many times, however, it is desirable that the silicided portions of the source/drain regions 112 exhibit different operating characteristics.

Furthermore, as the size of semiconductor devices are reduced, it is desirable to use a metal gate electrode, such as a fully silicided gate electrode, to further reduce resistance. Attempts have been made to fabricate a highly conductive gate electrode by performing a silicidation process on the poly-cystalline semiconductor gate electrode, which is frequently a poly-silicon (poly-Si) material or poly-SiGe material. Generally, the silicidation reaction converts the poly-semiconductor material to a highly conductive silicide. One method of fabricating a semiconductor device having a fully silicided gate electrode is described in U.S. Pat. No. 6,475,874 entitled, "Damascene NiSi Metal Gate High-K Transistor," which is incorporated herein by reference.

Often, however a different type of metal is desired or a different amount of silicidation is desired in order to create varying work functions dependent upon the device and its characteristics. Thus, there is a need for a dual silicided structure in which characteristics may be tuned or optimized for a particular application.

SUMMARY OF THE INVENTION

These and other problems are generally reduced, solved or circumvented, and technical advantages are generally achieved, by embodiments of the present invention, which provides a semiconductor device having dual fully silicided gate electrodes.

In one embodiment of the present invention, a semiconductor device having a plurality of transistors that have gate electrodes silicided with different metals is provided. The transistors source and drain regions may also be silicided with the same or a different metal as the gate electrode of the transistor.

In another embodiment of the present invention, a method of forming a semiconductor having a transistor with a fully silicided gate electrode is provided. The method provides for siliciding the source/drain regions of the transistor and forming an etch stop layer over the source/drain regions. Thereafter, the gate electrode is silicided. The gate electrode may be silicided with the same or a different metal as the source/drain regions.

In yet another embodiment of the present invention, a method of forming a semiconductor having a first transistor and a second transistor with silicided gate electrodes is provided. The source/drain regions of the first and second transistor may be separately silicided with the same or a different metal or siliciding parameters. Similarly, the gate electrodes of the first and second transistors may be silicided separately with the same or different metals and may be silicided using the same or different siliciding parameters. The method allows for the source/drain regions and the gate electrode to be silicided separately to create the electrical characteristics most suitable for the application.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
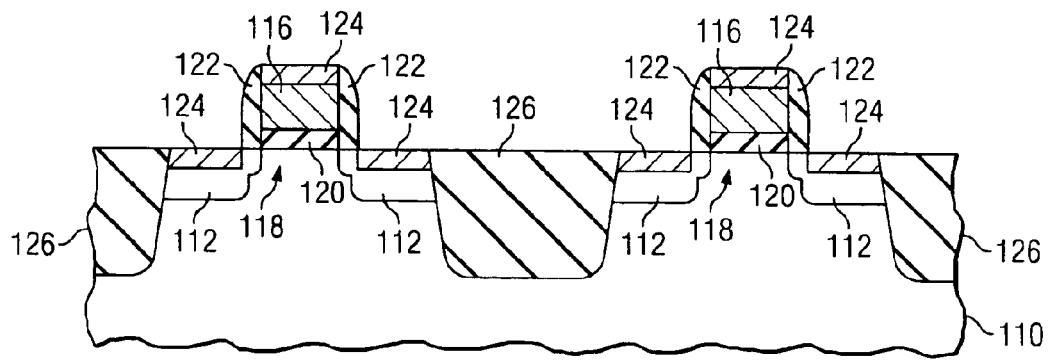
FIG. 1 is a cross-section view of a pair of transistors.

The making and using of the presently preferred embodiments are discussed in detail below. It should be appreciated, however, that the present invention provides many applicable inventive concepts that can be embodied in a wide variety of specific contexts. In particular, the method of the present invention is described in the context of forming a gate, a source, and a drain of a transistor. One of ordinary skill in the art, however, will appreciate that the process described herein may be used for forming any type of device or structure that utilizes silicided structures. Accordingly, the specific embodiments discussed herein are merely illustrative of specific ways to make and use the invention, and do not limit the scope of the invention.

FIGS. 2a–2i illustrate cross-section views of a portion of a wafer 200 during various steps of a first method embodiment of the present invention. The process begins in FIG. 2a, wherein a wafer 200 comprises a substrate 202 having a first transistor 204 and a second transistor 206 formed thereon. Each of the first transistor 204 and the second transistor 206 includes a gate electrode 212, source/drain regions 218, and a gate dielectric layer 216 formed between the gate electrode 212 and the substrate 202. Spacers 220 are formed along side the gate electrodes 212. Isolation structures 214 isolate the first transistor 204 and the second transistor 206 from each other and from other structures. The substrate 202 is preferably a bulk semiconductor substrate, which is typically doped to a concentration in the range of $10^{15}$ cm$^{-3}$ to $10^{18}$ cm$^{-3}$, or a semiconductor-on-insulator (SOI) wafer. Other materials, such as germanium, quartz, sapphire, and glass could alternatively be used for the substrate 202. The structure shown in FIG. 2a may be formed by standard processes known in the art and may comprise either NMOS structures, PMOS structures, or a combination thereof.

Figure 2A:
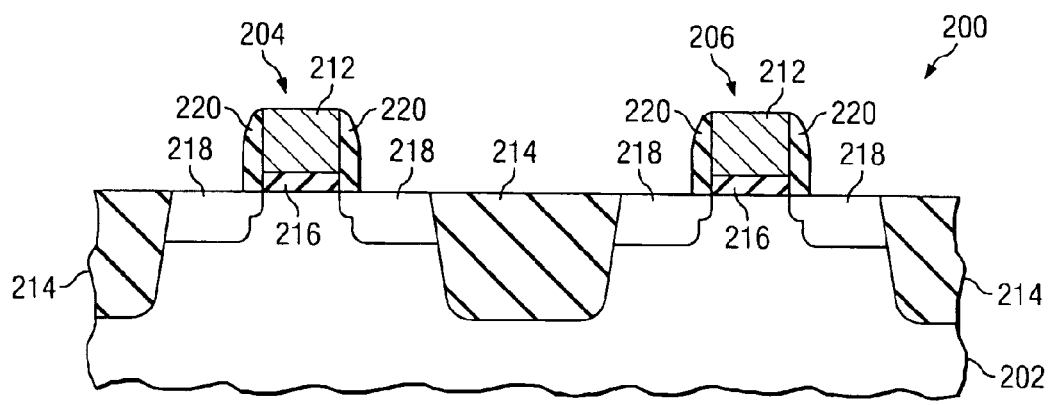
FIGS. 2a–2i are cross-section views of a wafer illustrating a process of forming a dual silicided gate of a transistor in accordance with one embodiment of the present invention.
Figure 2B:
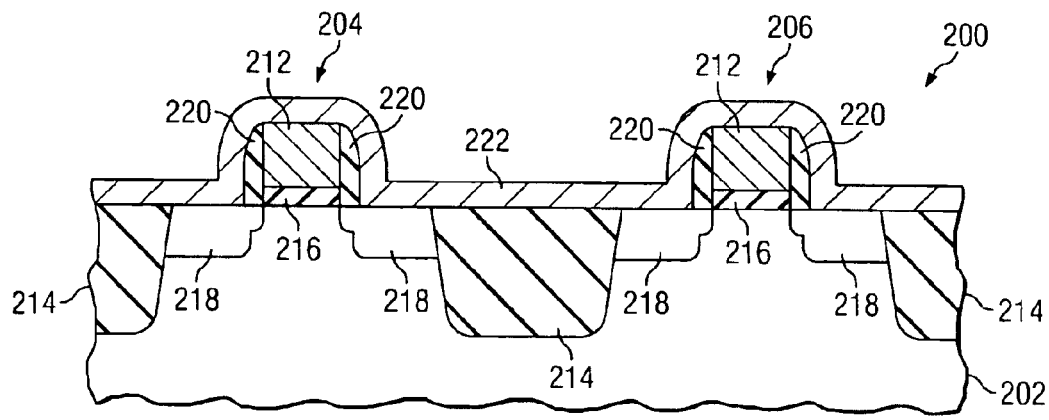

FIG. 2b illustrates the wafer 200 of FIG. 2a after a first metal layer 222 has been formed on the wafer 200, covering the first transistor 204 and the second transistor 206. The first metal layer 222 may be a single layer or a plurality of layers of a silicidation metal comprising, for example, nickel, cobalt, copper, molybdenum, titanium, tantalum, tungsten, erbium, zirconium, platinum, or a combination thereof, but most preferably, comprises nickel or a combination containing nickel. As will be discussed in greater detail below with reference to FIG. 2c, the first metal layer 222 is utilized in a salicide (self-aligned silicide) process to form contacts for the source/drain regions 218 and the gate electrodes 212 for the first transistor 204 and the second transistor 206.

The first metal layer 222 may be formed, for example, by conventional deposition techniques such as, for example, evaporation, sputter deposition, chemical vapor deposition (CVD), or the like. The first metal layer 222 is preferably about 10 Å to about 500 Å in thickness, but most preferably about 10 Å to about 300 Å in thickness.

Figure 2C:
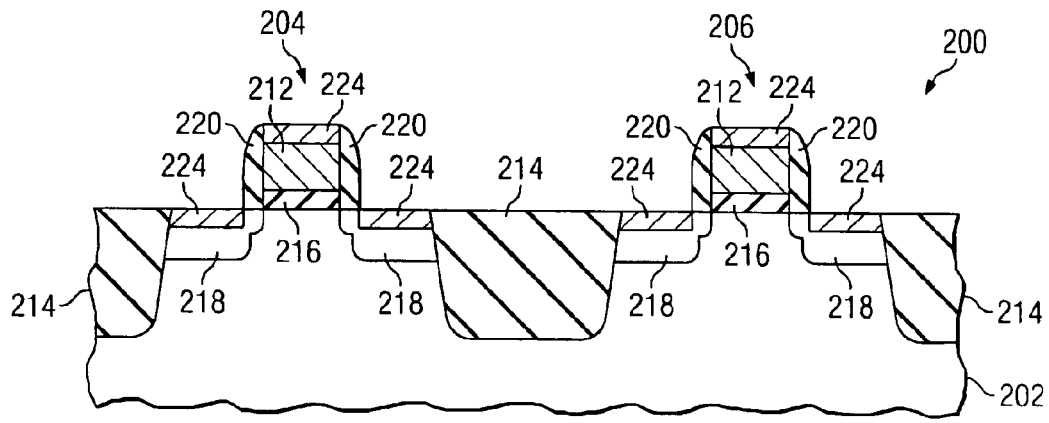

FIG. 2c illustrates the wafer 200 of FIG. 2b after a silicidation process has been formed and the excess material of the first metal layer 222 (FIG. 2b) has been removed. The silicidation process may be performed by annealing at a temperature of about 300° C. to about 1100° C. for about 0.1 seconds to about 300 seconds in an inert ambient preferably comprising nitrogen, but most preferably at a temperature of 300° C. to about 750° C. for about 1 second to about 200 seconds. Optionally, an additional RTA process may be performed to further lower the phase to a low-resistivity silicide. In particular, it has been found that CoSi$_2$ and TiSi$_2$, for example, benefit from an additional RTA process performed at a temperature from about 300° C. to about 1100° C. for 0.1 seconds to about 300 seconds, and more preferably, about 750° C. to about 1000° C.

The annealing process causes the first metal layer 222 to selectively react with exposed silicon regions (e.g., the source/drain regions 218) and the poly-semiconductor regions (e.g., the gate electrodes 212) to form a silicide, such as nickel silicide in the preferred embodiment in which the first metal layer 222 comprises nickel and the gate electrodes 212 comprise poly-Si. The areas that have been silicided are referred to as contact areas 224. As one of ordinary skill in the art will appreciate, the contact areas 224 for the source/drain regions 218 and the gate electrodes 212 reduce contact resistance between interconnect lines or contact plugs (not shown) and the source/drain regions 218 and between interconnect lines or contact plugs (not shown) and the gate electrodes 212.

The excess material of the first metal layer 222 (FIG. 2b) may be removed, for example, by utilizing an etchant having a high etch selectivity between the contact areas 224 and the excess material of the first metal layer 222. In the preferred embodiment in which the first metal layer 222 comprises nickel and the contact areas 224 comprise nickel silicide, suitable etchants include sulfuric acid, HCl, H$_2$O$_2$, hydrogen peroxide, NH$_4$OH, or the like.

Figure 2D:
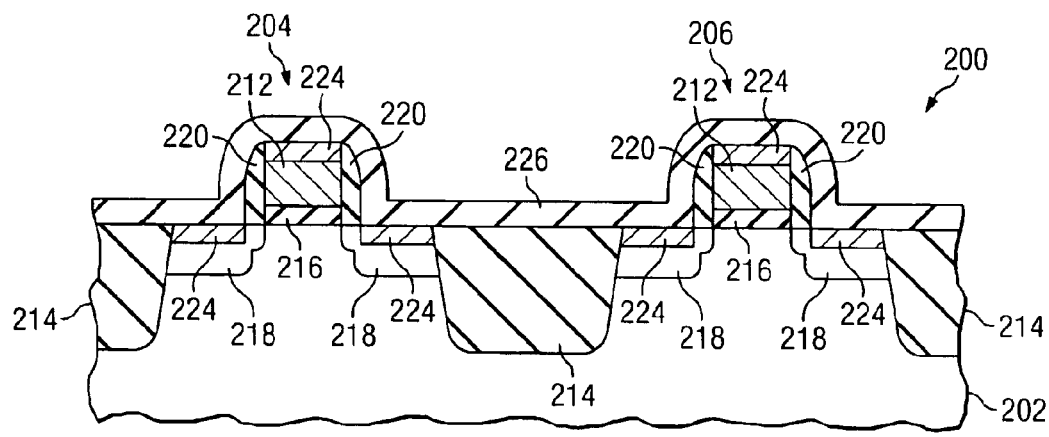

FIG. 2d illustrates the wafer 200 of FIG. 2c after a dielectric layer or an etch stop layer 226 has been formed. The etch stop layer or dielectric layer 226 acts as a stop layer for a chemical mechanical polishing (CMP) process described below with reference to FIG. 2e and also allows contact hole etch to stop on the etch stop layer without over-etching the contact areas 224. The etch stop layer 226 preferably comprises a layer containing Si, N, O, or C, and more preferably comprises silicon nitride or silicon oxynitride. The etch stop layer 226 may be formed, for example, by chemical vapor deposition or physical vapor deposition at a temperature of about 250° C. to about 650° C. and an ambient of silicon-containing and nitrogen-containing gases. The etch stop layer 226 is preferably about 50 Å to about 2000 Å in thickness, but most preferably about 50 Å to about 800 Å in thickness. An optional silicon oxide layer may be formed over the etch stop layer 226. A dielectric layer, such as a low-K material, preferably caps over the gate electrode to lift off the unwanted M1 connection to gate electrode during later processing steps. The silicon oxide layer may be formed by chemical vapor deposition at a temperature of about 250° C. to about 650° C.

Figure 2E:
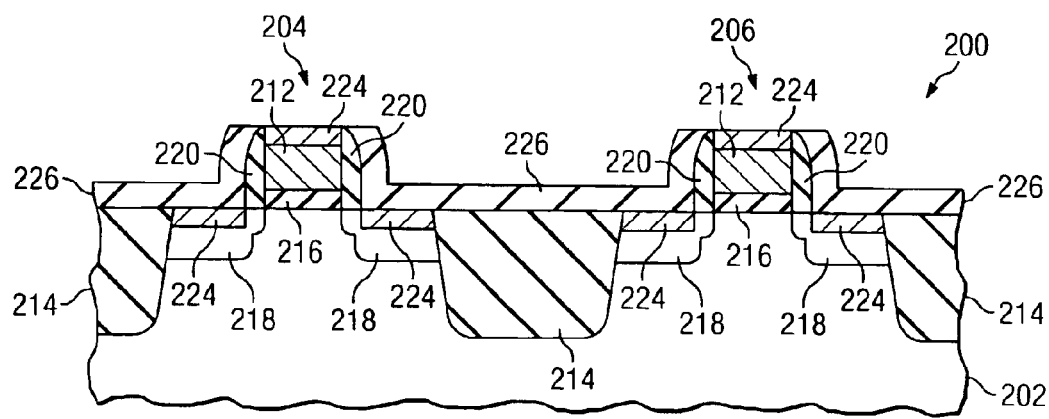

FIG. 2e illustrates the wafer 200 of FIG. 2d after a CMP process has been performed to expose the gate electrodes 212. The CMP process can be stopped on either the silicided region of the gate electrodes 212 or the poly-semiconductor region of the gate electrodes 212. The etch stop layer 226 is removed from the gate electrodes 212, thereby exposing the gate electrodes 212 and preparing the gate electrodes to be substantially silicided in subsequent steps. The etch stop layer 226 in regions other than on the gate electrodes 212 remains substantially untouched and protects the contact regions 224 formed in the source/drain regions 218 while the gate electrodes 212 are substantially silicided.

Figure 2F:
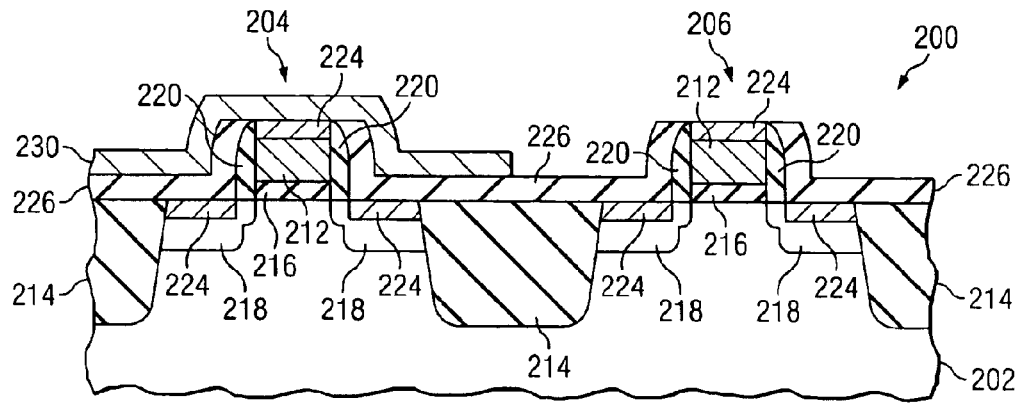

FIG. 2f illustrates the wafer 200 of FIG. 2e after a second metal layer 230 has been formed and patterned. As discussed above, one embodiment of the present invention provides a method of selectively forming a silicide contact area for the source/drain regions 218 and gate electrodes 212. The preferred embodiment illustrated in FIGS. 2a–2i formed silicided source/drain regions in a single process step, and in subsequent steps, a process is illustrated that forms silicided gate electrodes separately. Thus, the process allows each gate electrode to be optimized for its particular function and desired operating characteristics, such as varying the work function of the transistor.

Accordingly, FIG. 2f shows that the second metal layer 230 has been formed and patterned such that the second metal layer 230 covers the gate electrode 212 for the first transistor 204. The second metal layer 230 may be a single layer or a plurality of layers and may comprise any silicidation metal such as, for example, nickel, cobalt, copper, molybdenum, titanium, tantalum, tungsten, erbium, zirconium, platinum, or a combination thereof. As discussed above, however, the second metal layer 230 could cover other structures, such as the gate electrode 212 for the second transistor, thereby providing a method of forming silicided source/drain regions 218 differently than the gate electrodes 212 for the first transistor 204 and the second transistor 206.

The second metal layer 230 may comprise the same metal used to silicide the source/drain regions 218 or may comprise a different metal. The second metal layer 230 may be, for example, formed by CVD or PVD techniques known in the art.

Figure 2G:
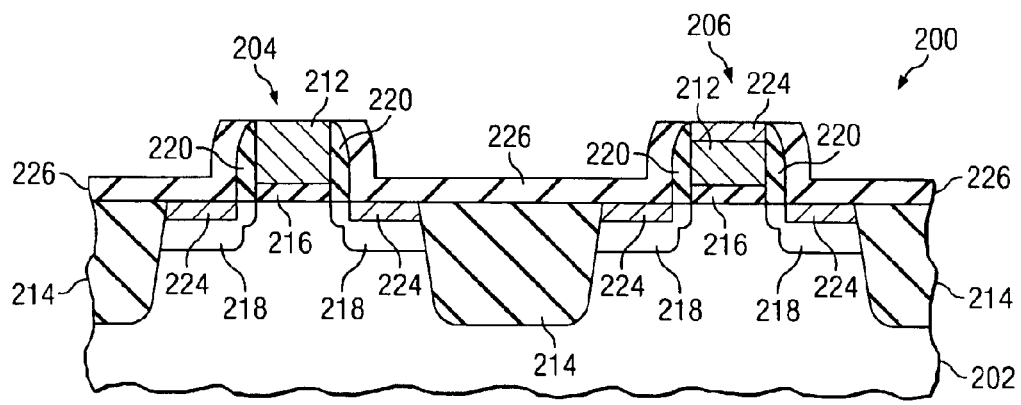

FIG. 2g illustrates the wafer 200 of FIG. 2f after a silicidation process has been performed and excess materials of the second metal layer 230 have been removed. It should be noted that because the second metal layer 230 was in contact with only the poly-semiconductor of the gate electrode 212 of the first transistor 204, the gate electrode 212 of the first transistor is the only section that became silicided in the second silicidation step.

The silicidation process may be performed, for example, by annealing. In the preferred embodiment in which the second metal layer 230 comprises nickel and the gate electrode 212 is about 100 Å to about 1000 Å in thickness, annealing is preferably performed at a temperature of about 300° C. to about 1100° C. for about 0.1 seconds to about 300 seconds, but most preferably at a temperature of 300° C. to about 750° C. for about 1 second to about 200 seconds. Optionally, an additional RTA process may be performed to further lower the phase to a low-resistivity silicide. In particular, it has been found that $CoSi_2$ and $TiSi_2$, for example, benefit from an additional RTA process performed at a temperature from about 300° C. to about 1100° C. for 0.1 seconds to about 300 seconds, and more preferably, about 750° C. to about 1000° C. The annealing parameters may be varied for different metals and different thicknesses. Furthermore, the annealing parameters may be varied to control the depth at which silicidation occurs. Preferably, however, the gate electrode 212 is completely silicided.

The excess metals of the second metal layer 230 may be removed, for example, by utilizing an etchant having a high etch selectivity between the second metal layer 230, the gate electrode 212 of the second transistor 206, and the etch stop layer 226. In the preferred embodiment in which the second metal layer 230 comprises nickel and the etch stop layer 226 comprises silicon and nitrogen, suitable etchants include solutions of sulfuric acid and $H_2O_2$, HCl and $H_2O_2$, $NH_4OH$ and $H_2O_2$, or the like. If the second metal layer 230 is other than nickel, then some other suitable etchant can be employed. For example, a solution of $H_2SO_4$ and $H_2O_2$ or a solution of $NH_4OH$ and $H_2O_2$ may be used if titanium is used for the second metal layer 230, and a solution of $H_2SO_4$ and $H_2O_2$ may be used if cobalt is used for the second metal layer 230.

Figure 2H:
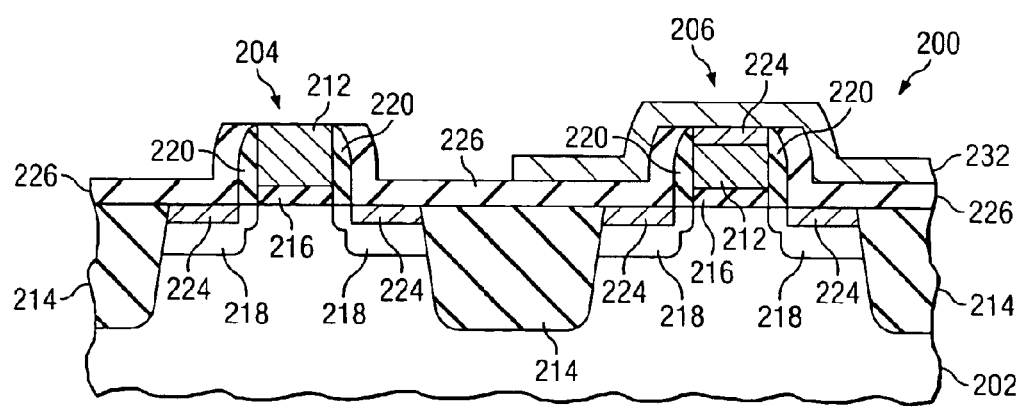

FIG. 2h illustrates the wafer 200 of FIG. 2g after a third metal layer 232 has been formed and patterned. As discussed above, while the illustrated embodiment separately suicides the gate electrodes 212 of the first transistor 204 and the second transistor 206, embodiments of the present invention may be utilized to silicide gate electrodes 212 for the first transistor 204 and the second transistor 206 in a single process step. In the preferred embodiment in which a silicidation process is performed on gate electrodes 212 for the first transistor 204 and the second transistor 206 separately to customize the characteristics of each of the gate electrodes 212 for the first transistor 204 and the second transistor 206, the third metal layer 232 is formed and patterned over the gate electrode 212 for the second transistor 206.

The third metal layer 232 may be a single layer or a plurality of layers and may comprise the same metal as used to silicide the source/drain regions 218 and/or the gate electrode 212 for the first transistor 204 and the second transistor 206. Optionally, however, the third metal layer 232 may comprise a metal different than the metal used to silicide one or both of the source/drain regions 218 and/or the gate electrode 212 for the fist transistor 204. For example, the third metal layer 232 may be nickel, cobalt, copper, molybdenum, titanium, tantalum, tungsten, erbium, zirconium, platinum, or a combination thereof. The third metal layer 232 may be, for example, formed by CVD or PVD techniques known in the art and is preferably about 50 Å to about 1000 Å in thickness.

Figure 2I:
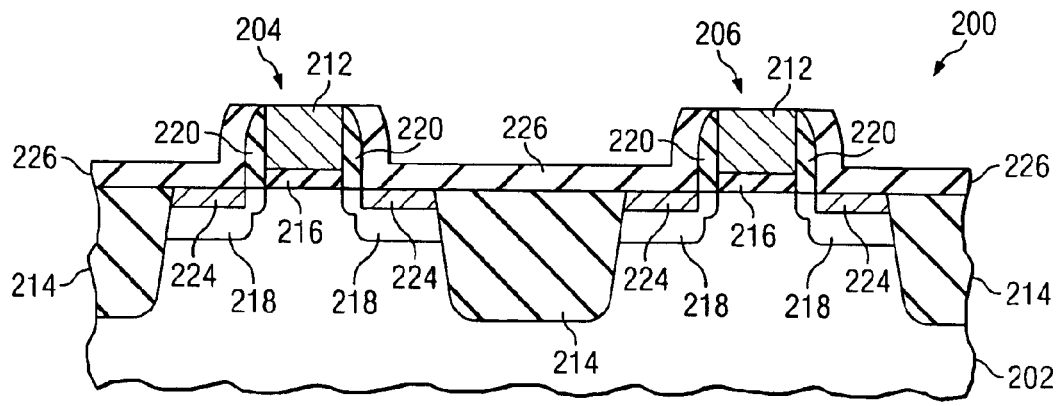

FIG. 2i illustrates the wafer 200 of FIG. 2h after a silicidation process has been performed and excess materials of the third metal layer 232 have been removed. It should be noted that because the third metal layer 232 was in contact with only the poly-semiconductor of the gate electrode 212 of the second transistor 206, the gate electrode 212 of the second transistor 206 is the only section that became silicided in this third silicidation step.

The silicidation process may be performed, for example, by annealing. In the preferred embodiment in which the third metal layer 232 and the gate electrode 212 of the second transistor 206 is about 50 Å to about 1000 Å in thickness, annealing is preferably performed at a temperature of about 300° C. to about 1100° C. for about 0.1 seconds to about 300 seconds in an ambient of nitrogen, but most preferably at a temperature of 300° C. to about 750° C. for about 1 second to about 200 seconds. Optionally, an additional RTA process may be performed to further lower the phase to a low-resistivity silicide. In particular, it has been found that $CoSi_2$ and $TiSi_2$, for example, benefit from an additional RTA process performed at a temperature of about 300° C. to about 1100° C. for 0.1 seconds to about 300 seconds, and more preferably, about 750° C. to about 1000° C. The annealing parameters may be varied for different metals and different thicknesses. Furthermore, the annealing parameters may be varied to control the depth at which silicidation occurs.

It should be noted that the second annealing process may affect the resistance or sheet resistivity of the suicides formed in prior steps. For example, the resistance of the first silicide formed may increase when it is subjected to the second annealing. In the preferred embodiment, the thermal budget of each annealing step is preferably lower than that of the prior annealing steps. In yet another embodiment, the annealing or the silicidation process is performed after the second and the third metal have been deposited.

The excess materials of the third metal layer 232 may be removed, for example, by utilizing an etchant having a high etch selectivity between the excess materials of the third metal layer 232 and the etch stop layer 226 and between the excess materials of the third metal layer 232 and the gate electrodes 212 of the first transistor 204 and the second transistor 206. In the preferred embodiment in which the third metal layer 232 comprises nickel and the etch stop layer 226 comprises silicon and nitrogen, suitable etchants include sulfuric acid, nitric acid, hydrogen peroxide, or the like.

Thereafter, standard processing steps may be performed to complete fabrication of the semiconductor device. For example, an interlayer dielectric (ILD) layer and contacts therethrough may be formed.

FIGS. 3a–3k illustrate cross-section views of a portion of a wafer 300 during various steps of a second method embodiment of the present invention. One of ordinary skill in the art will appreciate that the first method embodiment described above provides a semiconductor having a first transistor with a gate electrode silicided differently from a gate electrode of a second transistor. The source/drain regions of the first transistor and the second transistor are silicided a similar amount in a single process step. The process described in FIGS. 3a–3k describes a method in which each of the gate electrodes of the first and second transistor and each of the source/drain regions of the first and second transistors are silicided separately, allowing for greater control of the electrical characteristics of the semiconductor devices.

Figure 3A:
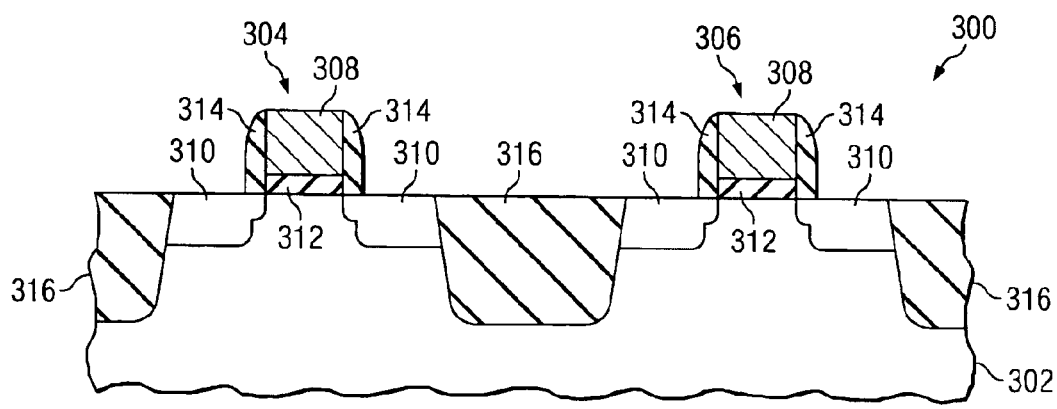
FIGS. 3a–3k are cross-section views of a wafer illustrating a process of transistors having source/drain regions and gate electrodes silicided separately in accordance with one embodiment of the present invention.

The process begins in FIG. 3a, wherein a wafer 300 has been provided similar to the wafer 200 of FIG. 2a. The wafer 300 has a substrate 302 with a first transistor 304 and a second transistor 306 formed thereon. Each of the first transistor 304 and the second transistor 306 have a gate electrode 308, source/drain region 310, and a gate dielectric layer 312 formed between the gate electrode 308 and the substrate 302. Spacers 314 are formed along the sides of the gate electrode 308. Isolation structures 316 may isolate the first transistor 304 and the second transistor 306 from each other and from other structures. The substrate 302 may be, for example, a bulk semiconductor substrate or, more preferably, a bulk silicon substrate. The substrate is preferably doped to a concentration in the range of $10^{15}$ cm$^{-3}$ to $10^{18}$ cm$^{-3}$, or a semiconductor-on-insulator wafer. Other materials, such as germanium, quartz, sapphire, and glass could alternatively be used for the substrate 302. The structure shown in FIG. 3a may be formed by standard processes known in the art and may comprise either NMOS structures, PMOS structures, a combination thereof, or the like.

Figure 3B:
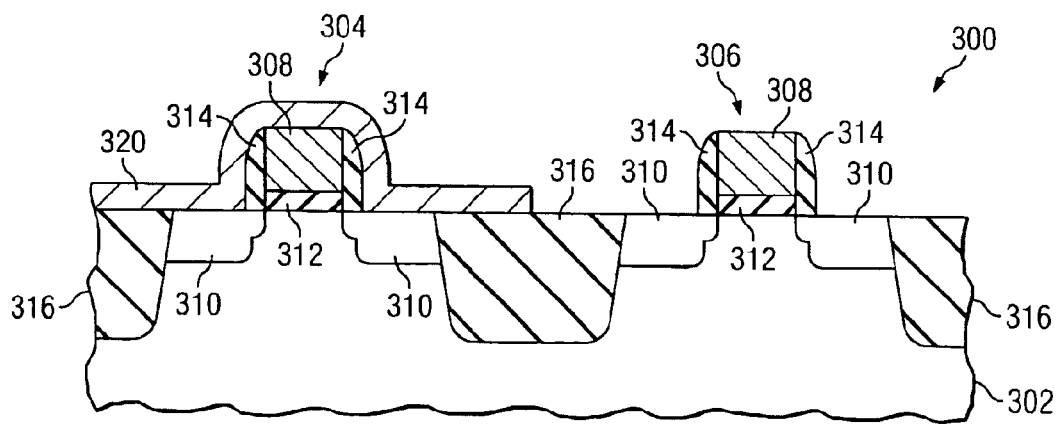

FIG. 3b illustrates the wafer 300 of FIG. 3a after a first metal layer 320 has been formed over the first transistor 304. The first metal layer 320 is used in subsequent steps to silicide the source/drain regions 310 and the gate electrode 308 of the first transistor 304. The first metal layer 320 may be a single layer or a plurality of layers, and may comprise any silicidation metal such as, for example, nickel, cobalt, copper, molybdenum, titanium, tantalum, tungsten, erbium, zirconium, platinum, or a combination thereof, but most preferably, comprises nickel or a combination containing nickel.

The first metal layer 320 may be formed, for example, by conventional deposition techniques such as evaporation, sputter deposition, or chemical vapor deposition (CVD). The first metal layer 320 is preferably about 10 Å to about 500 Å in thickness, but most preferably about 10 Å to about 300 Å in thickness.

Figure 3C:
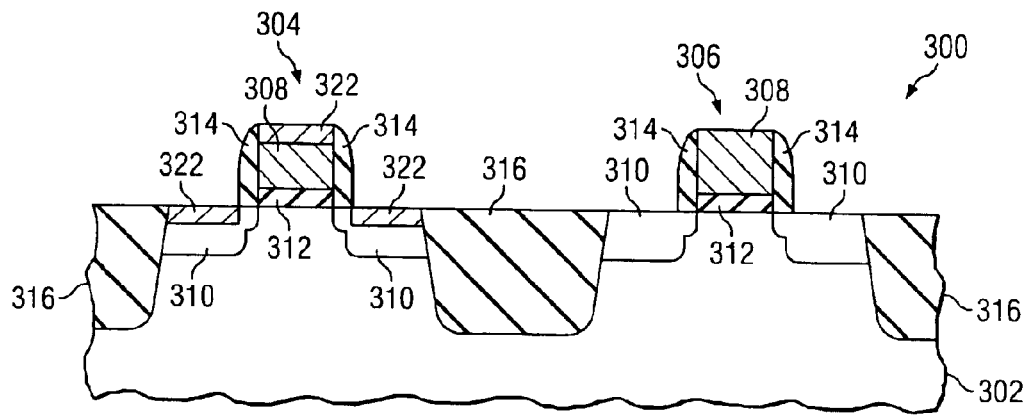

FIG. 3c illustrates the wafer 300 of FIG. 3b after a silicidation process has been performed and the excess material of the first metal layer 320 (FIG. 3b) has been removed. The silicide process may be performed by annealing at a temperature of about 300° C. to about 700° C. for about 0.1 seconds to about 300 seconds in an ambient of nitrogen, but most preferably at a temperature of 300° C. to about 600° C. for about 1 second to about 200 seconds. The annealing process causes the first metal layer 320 to selectively react with silicon and poly-semiconductor regions in which the first metal layer 320 is in contact, e.g., the source/drain regions 310 and the gate electrode 308 of the first transistor 304. As a result of the annealing process, a portion of the source/drain regions 310 and the gate electrode 308 become a silicide, providing a low resistance contact area for interconnects (not shown). The silicided areas are referred to as contact areas 322.

The excess material of the first metal layer 320 (FIG. 3b) may be removed, for example, by utilizing an etchant having a high etch selectivity between the contact areas 322 and the excess material of the first metal layer 320. In the preferred embodiment in which the first metal layer 320 comprises nickel and the contact areas 322 comprise nickel silicide, suitable etchants include solutions of sulfuric acid and $H_2O_2$, HCl and $H_2O_2$, $NH_4OH$ and $H_2O_2$ or the like.

Figure 3D:
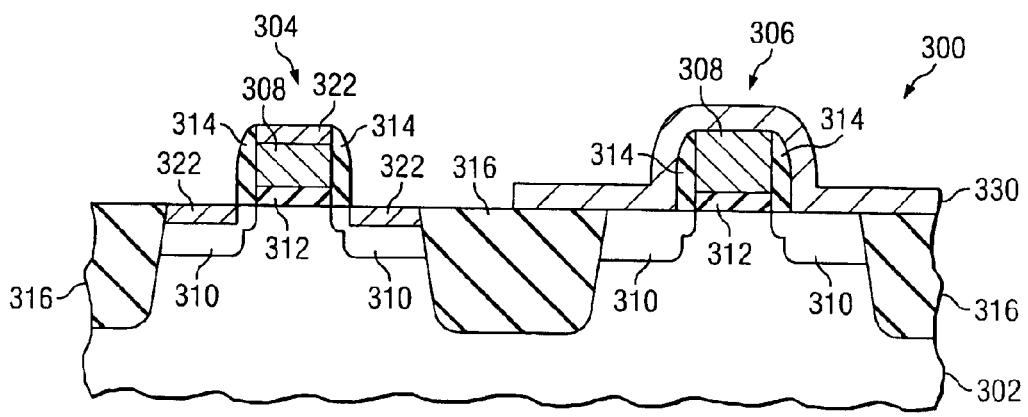
Figure 3E:
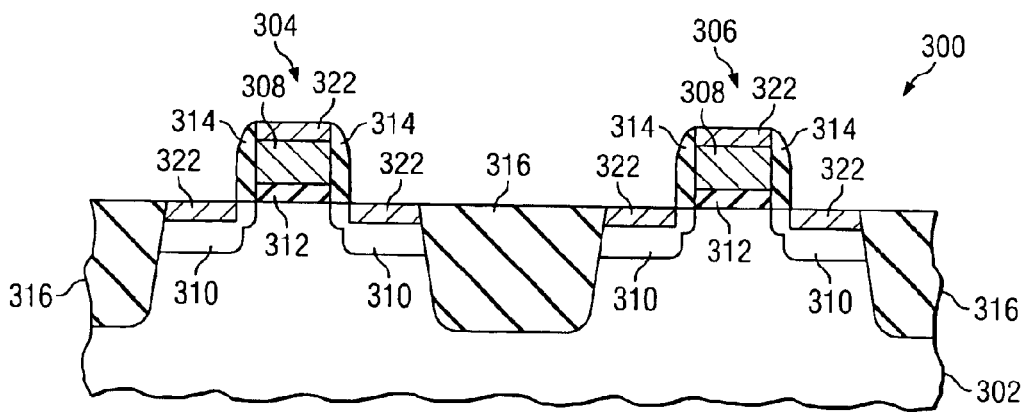

FIGS. 3d and 3e illustrate the wafer 300 of FIG. 3c after performing steps similar to the steps discussed above with reference to FIGS. 3b and 3c, except the processes are performed for the second transistor 306 rather than the first transistor 304. In FIG. 3d, a second metal layer 330 is formed over the second transistor 306, and in FIG. 3e, a silicidation process is performed and the excess material of the second metal layer 330 is removed.

Similar to the first metal layer 320, the second metal layer 330 may be a single layer or bi-layers and any silicidation metal such as, for example, nickel, cobalt, copper, molybdenum, titanium, tantalum, tungsten, erbium, zirconium, platinum, or a combination thereof, and may be formed, for example, by conventional deposition techniques such as chemical vapor deposition (CVD), and physical vapor deposition (PVD). The second metal layer 330 is preferably about 10 Å to about 500 Å in thickness, but most preferably about 10 Å to about 300 Å in thickness.

The second metal layer 330 may be a metal different from or the same as the first metal layer 320. Furthermore, the silicidation process of FIG. 3e may be different from or the same as the silicidation process of FIG. 3c. The time, the temperature, the ambient, or a combination thereof may be modified accordingly. By allowing the different metals to be used as well as a different silicidation process, the electrical characteristics of the source/drain regions 310 of the first transistor 304 and the second transistor 306 may be individually fabricated.

The excess material of the second metal layer 330 (FIG. 3d) may be removed, for example, by utilizing an etchant having a high etch selectivity between the silicided area of the first transistor 304, the silicided area of the second transistor 306, and the excess material of the second metal layer 330. In the preferred embodiment in which the second metal layer 330 comprises nickel and the contact areas 322 comprise nickel silicide, suitable etchants include sulfuric acid, nitric acid, hydrogen peroxide, or the like.

Figure 3F:
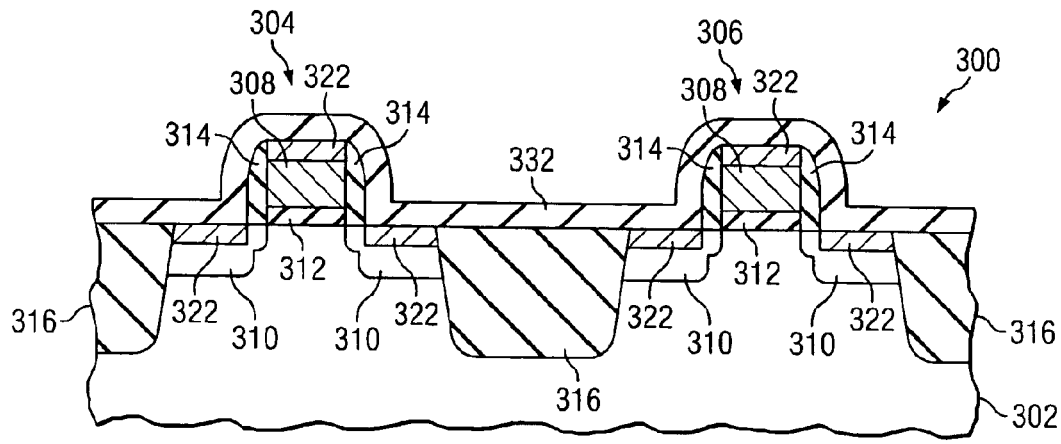

FIG. 3f illustrates the wafer 300 of FIG. 3e after an etch stop layer 332 has been formed on the wafer 300. The etch stop layer 332 acts as a stop layer for a CMP process described below with reference to FIG. 3g. The etch stop layer 332 is preferably a film comprising silicon, nitrogen, or oxygen. The etch stop layer 332 may be formed, for example, by chemical vapor deposition or physical vapor deposition at a temperature of about 250° C. to about 650° C. in an ambient of silicon-containing and nitrogen-containing gases. The etch stop layer 332 is preferably about 50 Å to about 2000 Å in thickness, but most preferably about 50 Å to about 800 Å in thickness.

Figure 3G:
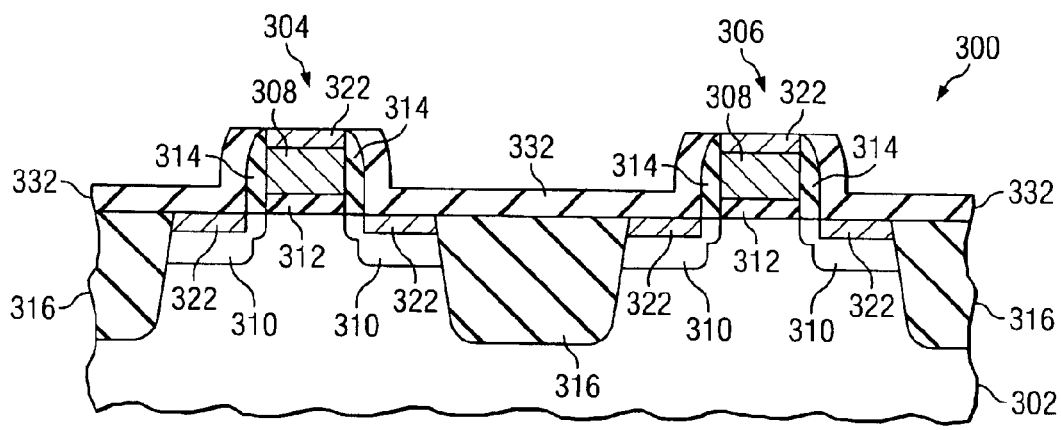

FIG. 3g illustrates the wafer 300 of FIG. 3f after a CMP process has been performed to expose the gate electrodes 308 of the first transistor 304 and the second transistor 306. The CMP process may be stopped on the silicided area of the gate electrodes 308 of the first transistor 304 and the second transistor 306 or may be stopped on the poly-semiconductor of the gate electrodes 308 of the first transistor 304 and the second transistor 306. The etch stop layer 332 in regions other than on the gate electrodes 308 remains substantially untouched and protects the source/drain regions 310 during the silicidation process.

Figure 3H:
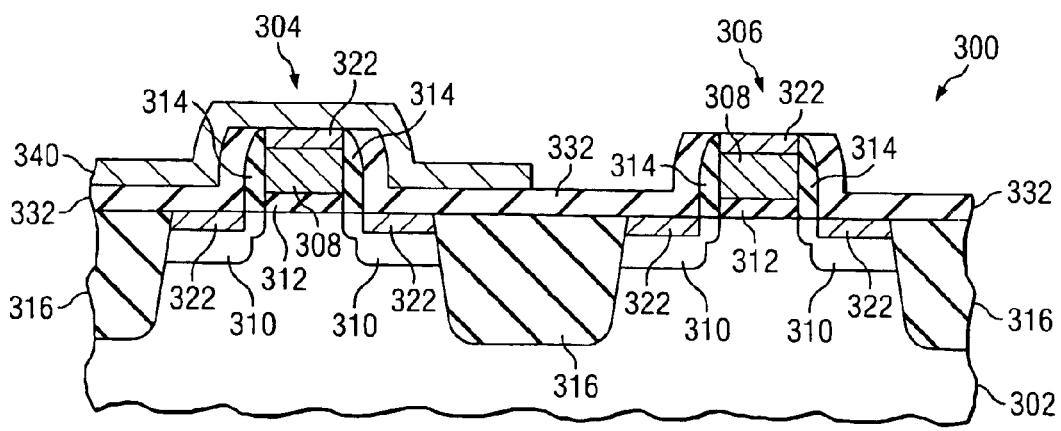

FIG. 3h illustrates the wafer 300 of FIG. 3g after a third metal layer 340 has been formed over the first transistor 304 on the wafer 300. It should be noted that the third metal layer 340 contacts the gate electrode 308 of the first transistor 304, but does not contact the source/drain regions 310 of the first transistor 304 because of the intervening etch stop layer 332. In this manner, the degree of silicidation of the gate electrode 308 of the first transistor 304 can be determined independently of the source/drain regions of the first transistor 304.

Preferably, the third metal layer 340 is a silicidation metal of the same type as the silicidation metal utilized for the source/drain regions 310 of the first transistor 304. A different silicidation metal, however, may be used. The third metal layer 340 may be formed, for example, by conventional deposition techniques such as sputter deposition. The third metal layer 340 is preferably about 100 Å to about 1000 Å in thickness, but most preferably about 100 Å to about 800 Å in thickness.

Figure 3I:
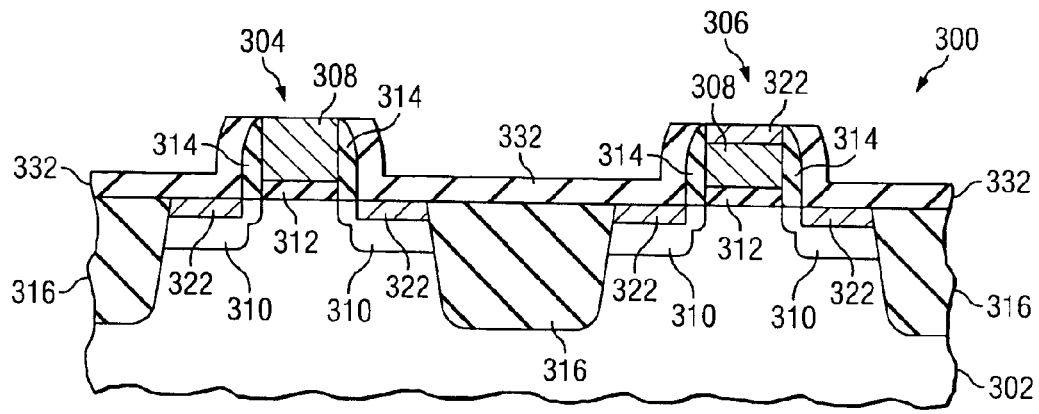

FIG. 3i illustrates the wafer 300 of FIG. 3h after a silicidation process has been performed and the excess material of the third metal layer 340 (FIG. 3h) has been removed. The silicidation process may be performed by annealing at a temperature of about 300° C. to about 1100° C. for about 0.1 seconds to about 300 seconds in an ambient of nitrogen, but most preferably at a temperature of 300° C. to about 750° C. for about 1 second to about 200 seconds. As a result of the annealing process, the gate electrode 308 of the first transistor 304 is preferably substantially silicided. More or less silicidation, however, may be used as required for any particular application.

The excess material of the third metal layer 340 (FIG. 3h) may be removed, for example, by utilizing an etchant having a high etch selectivity between the excess material of the third metal layer 340 and the silicided gate electrodes 308 of the first transistor 304 and the second transistor 306. In the preferred embodiment in which the third metal layer 340 comprises nickel and the contact areas 322 comprise nickel silicide, suitable etchants include solutions of sulfuric acid and $H_2O_2$, HCl and $H_2O_2$, $NH_4OH$ and $H_2O_2$, hydrogen peroxide, or the like.

Figure 3J:
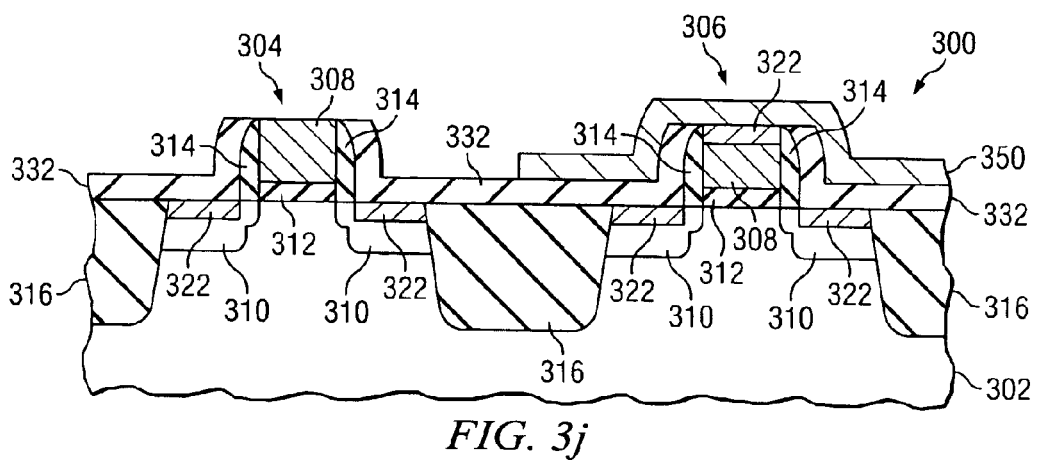
Figure 3K:
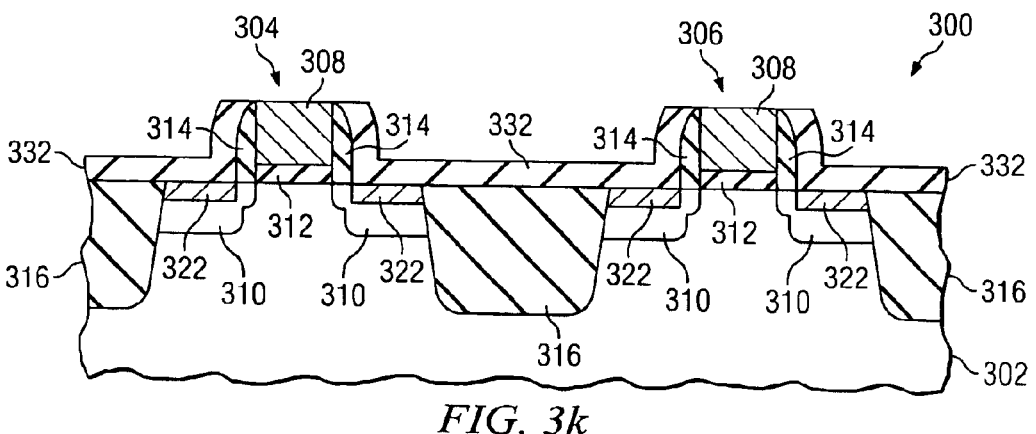

FIGS. 3j and 3k illustrate the wafer 300 of FIG. 3i performing steps similar to the steps discussed above with reference to FIGS. 3h and 3i, except that the steps are performed for the second transistor 306 rather than the first transistor 304. In FIG. 3j, a fourth metal layer 350 is formed over the second transistor 306, and in FIG. 3k, a silicidation process is performed and the excess material of the fourth metal layer 350 is removed.

Similar to the third metal layer 340, the fourth metal layer 350 may be a single layer or a plurality of layers of a silicidation metal, such as, for example, nickel, cobalt, copper, molybdenum, titanium, tantalum, tungsten, erbium, zirconium, platinum, or a combination thereof, and may be formed, for example, by conventional deposition techniques such as sputter or chemical vapor deposition (CVD). Preferably, however, the fourth metal layer 350 is a silicidation metal of the same type as the silicidation metal utilized for the source/drain regions 310 of the second transistor 306. A different silicidation metal, however, may be used. The fourth metal layer 350 is preferably about 100 Å to about 1000 Å in thickness, but most preferably about 100 Å to about 800 Å in thickness.

Furthermore, the silicidation process of FIG. 3k may be different from the silicidation process of FIG. 3i. The time, the temperature, the ambient, or a combination thereof may be modified to account for the use of a different metal or silicidation process. By allowing the different metals to be used as well as a different silicidation process, the electrical characteristics of the gate electrode 308 of the first transistor 304 and the second transistor 306 may be individually fabricated. The excess material of the fourth metal layer 350 (FIG. 3j) may be removed, for example, by utilizing an etchant having a high etch selectivity between the excess material of the fourth metal layer 350 and silicided area of the gate electrodes 308 of the first transistor 304 and the second transistor 306. In the preferred embodiment in which the fourth metal layer 350 comprises nickel and the contact areas 322 comprise nickel silicide, suitable etchants include solutions of sulfuric acid and $H_2O_2$, HCl and $H_2O_2$, $NH_4OH$ and $H_2O_2$, or the like.

Thereafter, standard processing steps may be performed to complete fabrication of the semiconductor device. For example, an interlayer dielectric (ILD) layer and contacts therethrough may be formed.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

For example, while the present invention has been illustrated with reference to fabricating two semiconductor devices, it is understood that the present invention may be extended to fabricate three of more semiconductor devices wherein each device is silicided individually. Furthermore, even though the embodiments illustrated herein utilized source/drain regions that were silicided in a single process step, the source and drain regions may be silicided individually, giving the source and drain regions different electrical characteristics.

Although particular embodiments of the invention have been described in detail, it is understood that the invention is not limited correspondingly in scope, but includes all changes, modifications, and equivalents coming within the spirit and terms of the claims appended hereto. For example, differing types of materials and differing thicknesses may be used, and the like. Accordingly, it is understood that this invention may be extended to other structures and materials, and thus, the specification and figures are to be regarded in an illustrative rather than a restrictive sense.

What is claimed is:

1. A method of forming a semiconductor device, the method comprising:
   siliciding a source region and a drain region of a first transistor formed on a substrate, the first transistor having a gate electrode with spacers formed alongside the gate electrode;
   forming a dielectric layer over the gate electrode, the spacers, the source region and the drain region, the dielectric layer being different than the spacers and having a thickness less than the gate electrode;
   removing the dielectric layer over the gate electrode; and
   siliciding the gate electrode of the first transistor.

2. The method of claim 1 wherein the step of siliciding the source region and the drain region is performed during the same process steps.

3. The method of claim 1 wherein the step of siliciding the source region and the drain region includes partially siliciding the gate electrode.

4. The method of claim 1 wherein the step of siliciding the gate electrode is performed by substantially fully siliciding the gate electrode.

5. The method of claim 1 wherein the step of siliciding the gate electrode is performed by forming a first metal layer on the gate electrode and annealing.

6. The method of claim 5 wherein the first metal layer comprises a plurality of layers.

7. The method of claim 1 wherein the step of siliciding the drain and the source are performed by forming a first metal layer on the source and the drain and annealing, and the step of siliciding the gate electrode is performed by forming a second metal layer on the gate electrode and annealing.

8. The method of claim 7 wherein the first metal layer is a metal different from the second metal layer.

9. The method of claim 7 wherein the second metal layer is a plurality of layers.

10. The method of claim 7 wherein the step of siliciding the source and the drain includes partially siliciding the gate electrode.

11. The method of claim 1 wherein the dielectric layer comprises silicon nitride or silicon oxynitride.

12. The method of claim 1 further comprising the step of forming a silicon oxide layer over the dielectric layer.

13. A method of forming a semiconductor device, the method comprising:
   siliciding a first source/drain region of a first transistor;
   siliciding a second source/drain region of a second transistor;
   forming a dielectric layer over the source/drain region and a first gate electrode of the first transistor and the source/drain region and a second gate electrode of the second transistor;
   removing the dielectric layer over the first gate electrode and the second gate electrode;
   siliciding the first gate electrode of the first transistor; and
   siliciding the second gate electrode of the second transistor in a different process step as the step of siliciding the fist gate electrode.

14. The method of claim 13 wherein the step of siliciding the first source/drain region is performed by depositing a first metal layer and annealing.

15. The method of claim 14 wherein the first metal layer is a plurality of layers.

16. The method of claim 13 wherein the step of siliciding the first source/drain region and the step of siliciding the second source/drain region is performed with different metals.

17. The method of claim 13 wherein the step of siliciding the first gate electrode and the step of siliciding the second gate electrode is performed with different metals.

18. The method of claim 13 wherein the step of siliciding the first source/drain region includes partially siliciding the first gate electrode.

19. The method of claim 13 wherein the step of siliciding the second source/drain region includes partially siliciding the second gate electrode.

20. The method of claim 13 wherein the step of siliciding the first gate electrode is performed by substantially fully siliciding the first gate electrode.

21. The method of claim 13 wherein the step of siliciding the second gate electrode is performed by substantially fully siliciding the second gate electrode.

22. The method of claim 13 wherein the step of siliciding the first gate electrode is performed by forming a third metal layer on the first gate electrode and annealing.

23. The method of claim 13 wherein the step of siliciding the second gate electrode is performed by forming a fourth metal layer on the second gate electrode and annealing.

24. The method of claim 13 wherein the dielectric layer comprises silicon nitride or silicon oxynitride.

25. The method of claim 13 further comprising the step of forming a silicon oxide layer over the dielectric layer.

26. A semiconductor device comprising:
   a first transistor; and
   a second transistor,
   wherein each of the first transistor and the second transistor includes a source, a drain, a gate electrode, and spacers formed alongside the gate electrode, the gate electrode of the first transistor and the gate electrode of the second transistor being silicided with different metals, and wherein a dielectric layer having a thickness less than a thickness of the gate electrode covers at least a portion of the source and the drain of the first and second transistors, the dielectric layer and the spacers being different layers.

27. The semiconductor device of claim 26 wherein the gate electrode of the first transistor is substantially fully silicided.

28. The semiconductor device of claim 26 wherein the gate electrode of the second transistor is substantially fully silicided.

29. The semiconductor device of claim 26 wherein the source and the drain of the first transistor is silicided with a first metal and the source and the drain of the second transistor are silicided with a second metal.

30. The semiconductor device of claim 26 wherein the source and the drain of the first transistor is silicided with a metal selected from the group comprising nickel, cobalt, copper, molybdenum, titanium, tantalum, tungsten, erbium, zirconium, platinum, and a combination thereof.

31. The semiconductor device of claim 26 wherein the gate electrode of the first transistor is silicided with a metal selected from the group comprising nickel, cobalt, copper, molybdenum, titanium, tantalum, tungsten, erbium, zirconium, platinum, and a combination thereof.

32. The semiconductor device of claim 26 wherein the source and the drain of the second transistor is silicided with a metal selected from the group comprising nickel, cobalt, copper, molybdenum, titanium, tantalum, tungsten, erbium, zirconium, platinum, and a combination thereof.

33. The semiconductor device of claim 26 wherein the gate electrode of the second transistor are silicided with a metal selected from the group comprising nickel, cobalt, copper, molybdenum, titanium, tantalum, tungsten, erbium, zirconium, platinum, and a combination thereof.

34. A method of forming a semiconductor device, the method comprising:
   forming a nitrogen-containing dielectric layer over a gate electrode, a source region, and a drain region of a first transistor formed on a substrate;
   removing the nitrogen-containing dielectric layer over the gate electrode;
   forming a first metal layer over the gate electrode and the nitrogen-containing dielectric layer, the first metal layer having a non-planar surface; and
   siliciding the gate electrode of the first transistor.

35. The method of claim 34 further comprising siliciding the source region and the drain region.

36. The method of claim 35 wherein the siliciding the source region and the drain region includes partially siliciding the gate electrode.

37. The method of claim 34 wherein the siliciding the gate electrode is performed by substantially fully siliciding the gate electrode.

38. The method of claim 34 wherein the siliciding the gate electrode is performed by annealing.

39. The method of claim 34 wherein the first metal layer comprises a plurality of layers.

40. The method of claim 34 wherein the nitrogen-containing dielectric layer comprises silicon nitride or silicon oxynitride.

41. The method of claim 34 further comprising the step of forming a silicon oxide layer over the nitrogen-containing dielectric layer.

* * * * *

UNITED STATES PATENT AND TRADEMARK OFFICE
CERTIFICATE OF CORRECTION

PATENT NO. : 6,905,922 B2
DATED : June 14, 2005
INVENTOR(S) : Lin et al.

It is certified that error appears in the above-identified patent and that said Letters Patent is hereby corrected as shown below:

Column 6,
Line 30, delete "suicides" and insert -- silicides --.

Signed and Sealed this

Twenty-fifth Day of October, 2005

JON W. DUDAS
*Director of the United States Patent and Trademark Office*